US010721842B1

(12) United States Patent
Fathi (10) Patent No.: US 10,721,842 B1
(45) Date of Patent: Jul. 21, 2020

(54) FLEXIBLE THERMAL COOLING ASSEMBLY (71) Applicant: HEWLETT PACKARD ENTERPRISE DEVELOPMENT LP, Houston, TX (US)

(72) Inventor: Nabeel Fathi, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/525,347

(22) Filed: Jul. 29, 2019

(51) Int. Cl.
H05K 7/20 (2006.01)

(52) U.S. Cl.
CPC ..... *H05K 7/20509* (2013.01); *H05K 7/20318* (2013.01); *H05K 7/20336* (2013.01); *H05K 7/20672* (2013.01)

(58) Field of Classification Search
None
See application file for complete search history.

(56) References Cited

U.S. PATENT DOCUMENTS

| 5,718,282 | A | * | 2/1998 | Bhatia | F28D 15/02 165/104.33 |
| 5,822,187 | A | * | 10/1998 | Garner | F28D 15/02 361/679.27 |
| 6,097,596 | A | * | 8/2000 | Cipolla | G06F 1/203 16/223 |
| 6,288,896 | B1 | * | 9/2001 | Hsu | G06F 1/182 165/104.33 |
| 6,507,488 | B1 | * | 1/2003 | Cipolla | G06F 1/203 165/104.33 |
| 6,507,490 | B2 | * | 1/2003 | Sasaki | G06F 1/203 16/223 |
| 7,639,498 | B2 | | 12/2009 | Campbell et al. | |
| 7,656,665 | B2 | * | 2/2010 | Lin | G06F 1/203 361/700 |
| 7,751,918 | B2 | | 7/2010 | Campbell et al. | |
| 7,791,876 | B2 | * | 9/2010 | Moore | G06F 1/203 16/221 |
| 7,907,397 | B2 | * | 3/2011 | Hung | G06F 1/1616 165/104.33 |
| 9,268,377 | B2 | * | 2/2016 | MacDonald | G06F 1/1681 |
| 10,091,911 | B2 | | 10/2018 | Kelty | |
| 2002/0008960 | A1 | * | 1/2002 | Mitchell | F28D 15/0233 361/679.52 |

(Continued)

OTHER PUBLICATIONS

Congatec AG, "A Smart Cooling Solution for Unbridled Processor Performance," 2019, pp. 1-5 (online), Retrieved from the Internet on Jul. 15, 2019 at URL: <congatec.com/technologies/cooling-solutions/heat-pipe-cooling.html>.

*Primary Examiner* — Courtney L Smith
(74) *Attorney, Agent, or Firm* — Nolte Intellectual Property Law Group (57) ABSTRACT A cooling assembly for cooling a heat source includes a cold plate to absorb heat from the heat source. The cold plate defines a first groove. A thermally conductive clamp is removably secured to a liquid cooling tube. The thermally conductive clamp defines a second groove. A heat pipe includes a first end to fit within the first groove in the cold plate and a second end to fit within the second groove in the thermally conductive clamp. The heat pipe transfers heat absorbed by the cold plate to the liquid cooling tube via the thermally conductive clamp.

17 Claims, 7 Drawing Sheets (56) References Cited

U.S. PATENT DOCUMENTS

| | | | |
|---|---|---|---|
| 2004/0080908 A1* | 4/2004 | Wang | G06F 1/203 |
| | | | 361/679.47 |
| 2012/0103571 A1* | 5/2012 | Wu | H05K 7/20781 |
| | | | 165/104.26 |
| 2017/0135246 A1 | 5/2017 | Lunsman et al. | |
| 2017/0142864 A1 | 5/2017 | Chanu et al. | |

* cited by examiner

FLEXIBLE THERMAL COOLING ASSEMBLY

BACKGROUND

A printed circuit board included in a computing device, such as a server, generates large amounts of heat. Heat is emitted by heat sources on the printed circuit board. These heat sources may include electronic components electrically connected to the printed circuit of the printed circuit board and supported by the printed circuit board. The heat sources may also include portions of the board, itself. Liquid cooling systems are sometimes used to cool the heat sources.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

While the invention is susceptible to various modifications and alternative forms, the drawings illustrate specific examples herein described in detail by way of example. It should be understood, however, that the description herein of specific examples is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Liquid cooling systems have been used to cool heat sources on printed circuit boards. As used herein, the terminology "heat source" refers to any electronic component supported by a printed circuit board or any portion of the printed circuit board that emits heat.

In traditional liquid cooling systems, liquid cooling tubes are routed around a printed circuit board to enable heat generated by the electronic components supported by the printed circuit board to be transferred into liquid coolant flowing through the liquid cooling tubes. In some situations, heat is transferred from a component into the liquid coolant by use of a cold plate device that is mounted to the component, while in other situations heat may be transferred from a component into the liquid coolant by simply bringing a liquid cooling tube into contact with the component. A cold plate is, generally speaking, a thermally conductive device that is installed in contact with the component to be cooled and thermally coupled to the liquid coolant, forming a low-resistance path through which heat may flow from the component into the liquid coolant. Conventional cold plates have liquid coolant flowing through a channel inside the cold plate, and are often designed specifically for the particular component they are intended to cool and to fit within a specific location within a specific system. Such cold plates are often used to cool high powered components, such as central processing units (CPUs). Cooling via contact between the cooling tube and a component to be cooled (without a cold plate) is often used to cool lower powered components, such as portions of the printed circuit board. As used herein, the terminology "liquid cooling tube" refers to any tube, conduit or pipe that is to carry a liquid coolant, such as deionized water, that absorbs heat.

Figure 1:
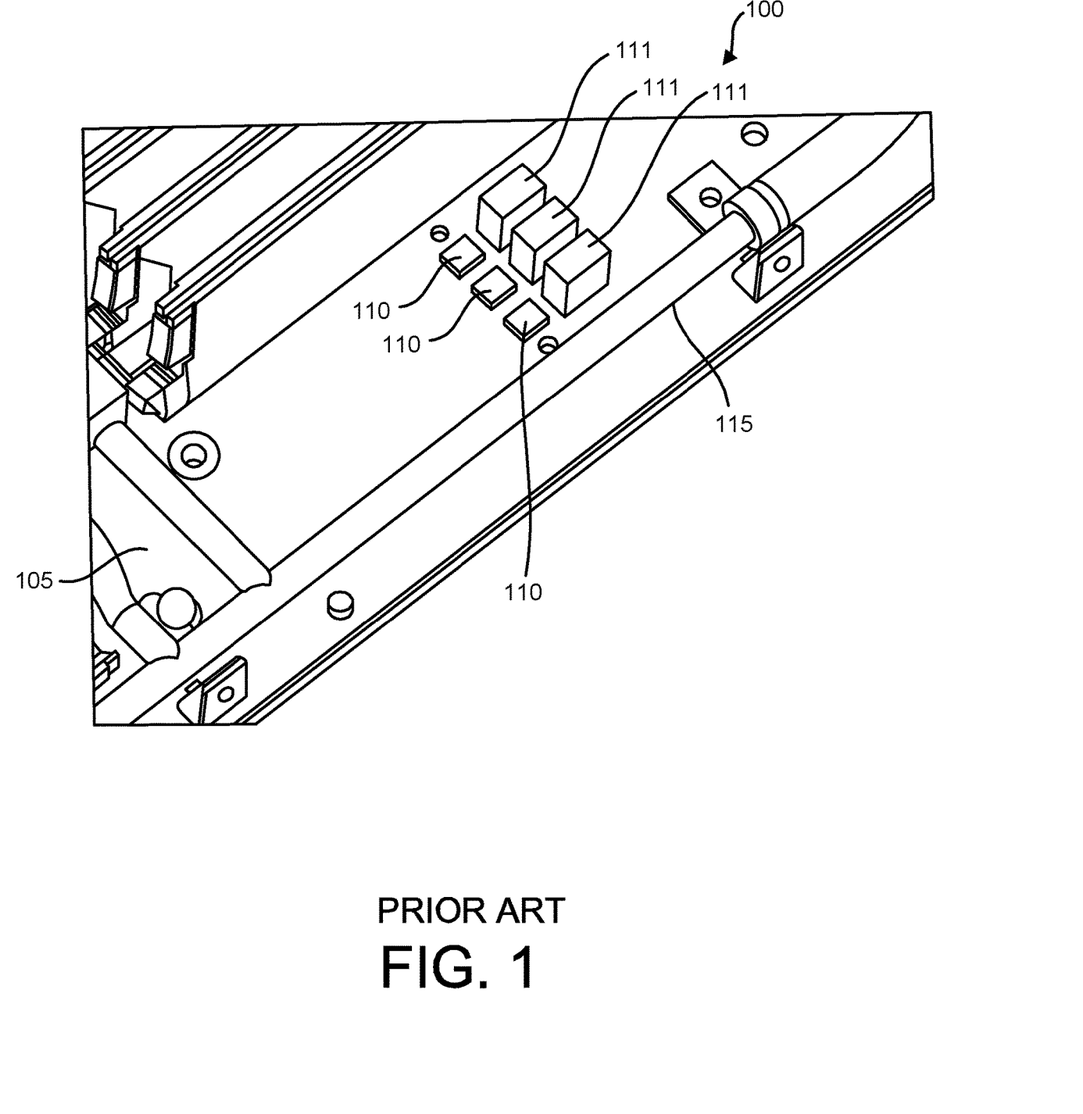
FIG. 1 is a perspective view of a conventional cooling system.

An example of a conventional cooling system is shown in FIG. 1. The system 100 includes one or more liquid cooling tubes 115 installed on a printed circuit board 105. The liquid cooling tube 115 is routed near (around, over, under, between, next to, etc.) electronic components or portions of the printed circuit board 105 as it loops through the system 100. The liquid cooling tube 115 is attached to the printed circuit board 105 using screws or other securing devices, often during manufacturing.

The liquid cooling tube 115 is pumped with a liquid coolant (not otherwise shown) from a cooling liquid supply line (not shown). The heat transfers to the liquid coolant in the liquid cooling tube 115, and the liquid coolant carries the heat away from the heat sources. The heated liquid coolant exits through a cooling liquid return line (not shown).

Once the printed circuit board 105 is packaged, for example, in a computing device, the route of the liquid cooling tube 115 is generally fixed. If, after installation of the liquid cooling tube 115, it is desired to liquid cool electronic components or portions of the printed circuit board 105 that were not originally thermally coupled to the liquid cooling tube 115, such as the electronic components 110, it is very difficult to retrofit the system to liquid cool the component. For example, it is very difficult to re-route the liquid cooling tube 115 to contact and thereby cool that electronic component or portion of the printed circuit board 105, as the liquid cooling tube 115 is already attached to the board 105 and may have a fixed shape that is resistant to changes in routing (e.g., copper tubing).

As another example, it may be difficult to install a conventional cold plate to cool the component, as a new cold plate may need to be designed especially for that component, the board 105 may not (or in some cases, cannot) have cold plate mounting infrastructure near the component, and there might not be sufficient room for a conventional cold plate. Furthermore, even if the conventional cold plate could be mounted to the component, changes to the liquid coolant loop may be needed in order to bring liquid coolant to the cold plate, such as changing the routing of the tube 115 or branching off to add new tubing, both of which are difficult.

Thus, either approach to retrofitting the device to cool the component (rerouting the tubes 115 to contact the heat source or installing a conventional cold plate) will be difficult. Such a need to retrofit an already manufactured device can occur, for example, when a component that is initially expected to stay within thermal requirements without liquid cooling turns out to generate more heat than expected in practice (e.g., a use-case of the device has changed, or components have been upgraded to higher-power components, etc.). Thus, the system 100 such as that shown in FIG. 1 is inflexible as the cooling provided is limited by the arrangement of the liquid cooling tube 115 on the printed circuit board 105.

Moreover, certain components or portions of the board 105 may be difficult to cool by direct contact with the cooling tube 115 or by using conventional cold plates, regardless of whether this is attempted during or after manufacture. This could be due to, for example, their location, their shape, their size, obstructions in the vicinity, structural limitations of the cooling tube 115 (e.g., minimum bend radii), etc. For example, even if it was known from the outset that it was desired to liquid cool the components 110, it may be difficult to route the cooling tube 115 to contact the components 110 due to other components, like the components 111, blocking the desired routing of the tube 115. Similarly, it may be difficult to install a conventional cold plate on the components 110, as there may be insufficient room for the cold plate or the mounting infrastructure, in addition to the difficulty of rerouting cooling lines to service the cold plate. Moreover, designing custom cold plates for each component to be so cooled may increase the number of distinct parts that need to be kept in inventory, thus increasing costs and complexity.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

In accordance with illustrative examples disclosed herein, a flexible cooling assembly is provided that may be dropped into a computing device including a printed circuit board, even after manufacture and packaging of the computing device. As used herein the terminology "cooling assembly" includes an assembly of components for cooling a heat source. The cooling assembly includes a cold plate, a heat pipe, and a thermally conductive clamp connected to an existing liquid cooling tube.

The terminology "cold plate" refers to a thermally conductive plate, such as a cooper or aluminum plate, that allows heat to be efficiently conducted away from a heat source. The terminology "heat pipe" refers to a metal pipe, e.g., a copper pipe, containing liquid that turns into vapor when the heat pipe comes into contact with a hot surface, the vapor condensing when the heat pipe comes into contact with a cold surface. The term "thermally conductive clamp" refers to a mechanical structure to attach the cooling assembly to the liquid cooling tube. The thermally conductive clamp is made of a thermally conductive material, such as copper or aluminum.

According to illustrative examples disclosed herein, a cold plate is positioned to absorb heat from a heat source, such as an electronic component supported by a printed circuit board or a portion of a printed circuit board that emits heat. A heat pipe is secured at one end to the cold plate. The heat pipe is secured at the other end by a thermally conductive clamp. The thermally conductive clamp, in turn, is secured to an existing liquid cooling tube installed on the printed circuit board. The heat pipe transfers the heat absorbed by the cold plate to the liquid cooling tube via the thermally conductive clamp. The cold plate may be positioned, removed, and re-positioned at any desired location with respect to the printed circuit board to cool heat sources, as the need arises. Thus, the examples disclosed herein may solve some of the difficulties noted above by enabling retrofitting or upgrading of already manufactured computing devices to provide liquid cooling to components that were previously not liquid cooled in the devices. Furthermore, examples disclosed herein may enable (during or after manufacture) liquid cooling of components that would otherwise be difficult to contact with the cooling tubes, as the cooling assembly may be able to reach places that the cooling tubes cannot. In addition, examples disclosed herein may reduce the need for complicated routing of the cooling tubes 115 (e.g., bending the tubes around obstacles to reach certain components), as some components that would otherwise need such complicated tube routing in order to be cooled may instead be cooled using the cooling assembly together with a simpler tube routing (e.g., fewer bends).

In addition, in some examples, the heat pipe is rotatably secured to the cold plate and rotatably secured to the clamp, which may enable the cold plate to be positioned at varying heights relative to the printed circuit board. This may allow the cooling assembly to be used to cool components having arbitrary heights. For example, the same type of cooling assembly may be usable to cool the relatively shorter components 110 and the relatively taller components 111. This may be beneficial in that it may reduce the need to design many different types of cooling assemblies that are customized to fit the particular dimensions of specific components, instead allowing one or a few type(s) of cooling assemblies to be used for many different components, which reduces the number of SKUs and the manufacturing costs and complexity. It may also be beneficial in that it may enable retrofitting or upgrading of already manufactured computing devices without having to precisely know in advance the specific dimensions of the components that are being retrofitted.

Figure 2:
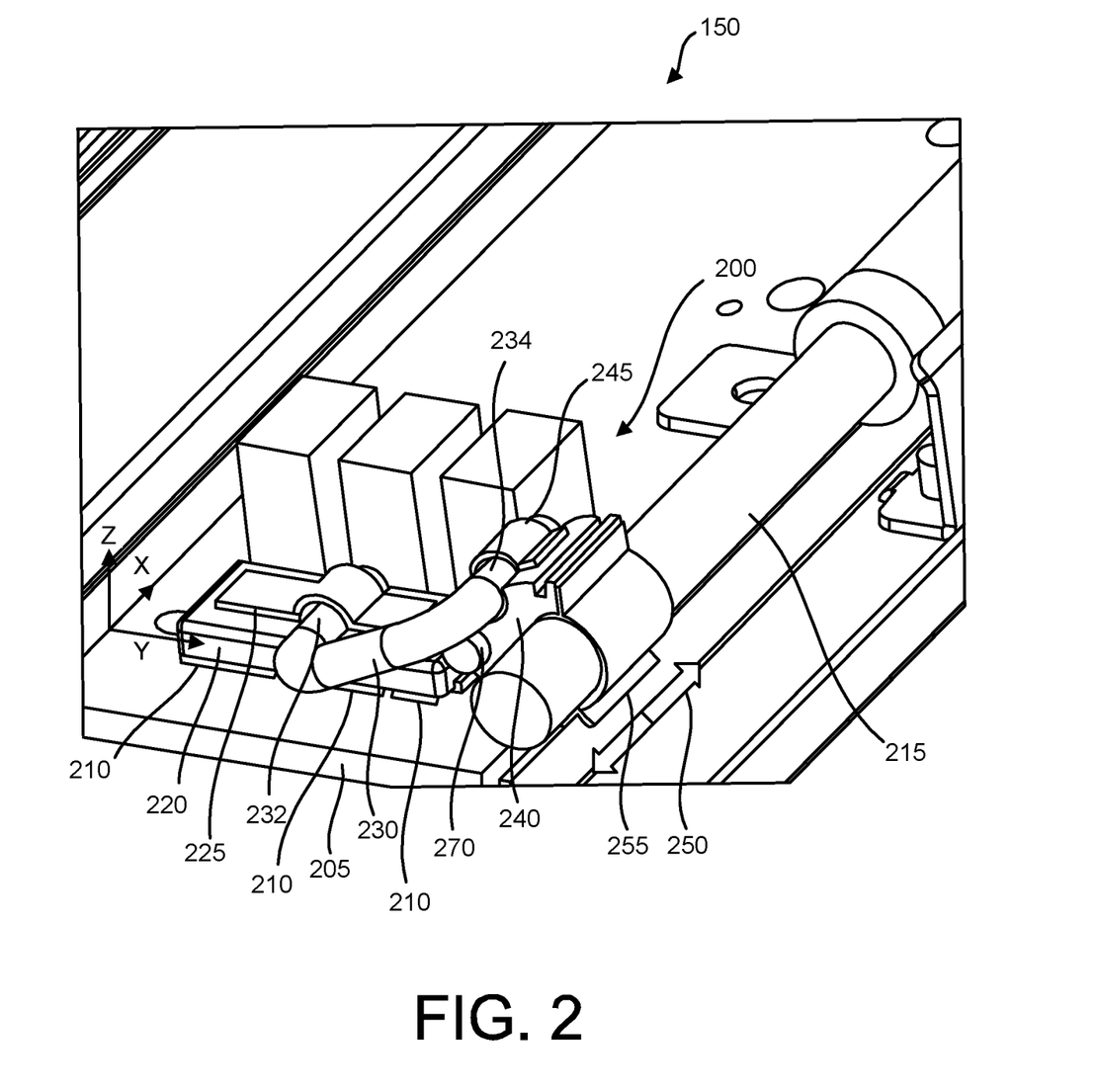
FIG. 2 is a perspective view of a system including a cooling assembly for cooling heat sources on a printed circuit board according to one or more examples of the disclosure.

FIG. 2 is a perspective view of a system including a cooling assembly for cooling heat sources on a printed circuit board according to one or more examples of the disclosure. As shown in FIG. 2, the system 150 includes a cooling assembly 200 and one or more liquid cooling tubes 215 installed on the printed circuit board 205. In some examples, the system 150 may be a computing device, such as the computing device 500 illustrated in FIG. 5 and described in more detail below.

In one example, the liquid cooling tube 215 may be installed on top of the printed circuit board 205 as shown in FIG. 2. In another example, the liquid cooling tube 215 may be mounted at least partially around sides of the printed circuit board 205.

The liquid cooling tube 215 is installed on the printed circuit board 205 along a particular route. The route may be determined by a variety of factors, such as for example, where there is available space on the board 205, where high-power components and their cold plates (not shown) are located on the board 205, and where electronic components or portions of the printed circuit board 205 that are to be cooled by direct contact with the cooling tube 215 are located. However, there may be electronic components or portions of the printed circuit board 205 that are not in contact with the liquid cooling tube 215 but that need to be liquid cooled. As noted above, this may occur, for example, when the component was not expected to need liquid cooling at the time the liquid cooling tube 215 is installed but that later it is determined that the component need to be liquid cooled.

Still referring to FIG. 2, according to illustrative examples, the cooling assembly 200 includes a cold plate 220. The cold plate 220 is positioned to absorb heat from a heat source 210 that is not in direct contact with the liquid cooling tube 215. The cold plate 220 may be positioned so as to establish a thermally conductive path from the heat source 210 to the cold plate 220. That is, the cold plate may be placed in thermal contact with the heat source 210, or in thermal contact with something that is itself thermally coupled with the heat source 210, such as a heat spreader, a conduction plate, or even the board 205 at a location immediately or near (e.g., within millimeters of) the heat source 210. As used herein, the terminology "thermal contact" refers to contact between two objects that establishes a thermally conductive heat flow path therebetween, and may include direct contact between the two objects or the sandwiching of an intermediary such as a thermal interface material (TIM) between the two objects.

In the example shown in FIG. 2, the cold plate 220 is positioned on one or more heat sources 210 on the printed circuit board 205 that emit heat that exceeds a specified tolerance but were not expected to emit such heat at the time the liquid cooling tube 215 was installed. The heat sources 210 shown in FIG. 2 are electronic components electrically connected to and supported by the printed circuit board 205. It should be appreciated that the cold plate 220 may also be positioned on one or more portions of the printed circuit board 205 that emit heat, referred to as a "hot spot".

Figure 3A:
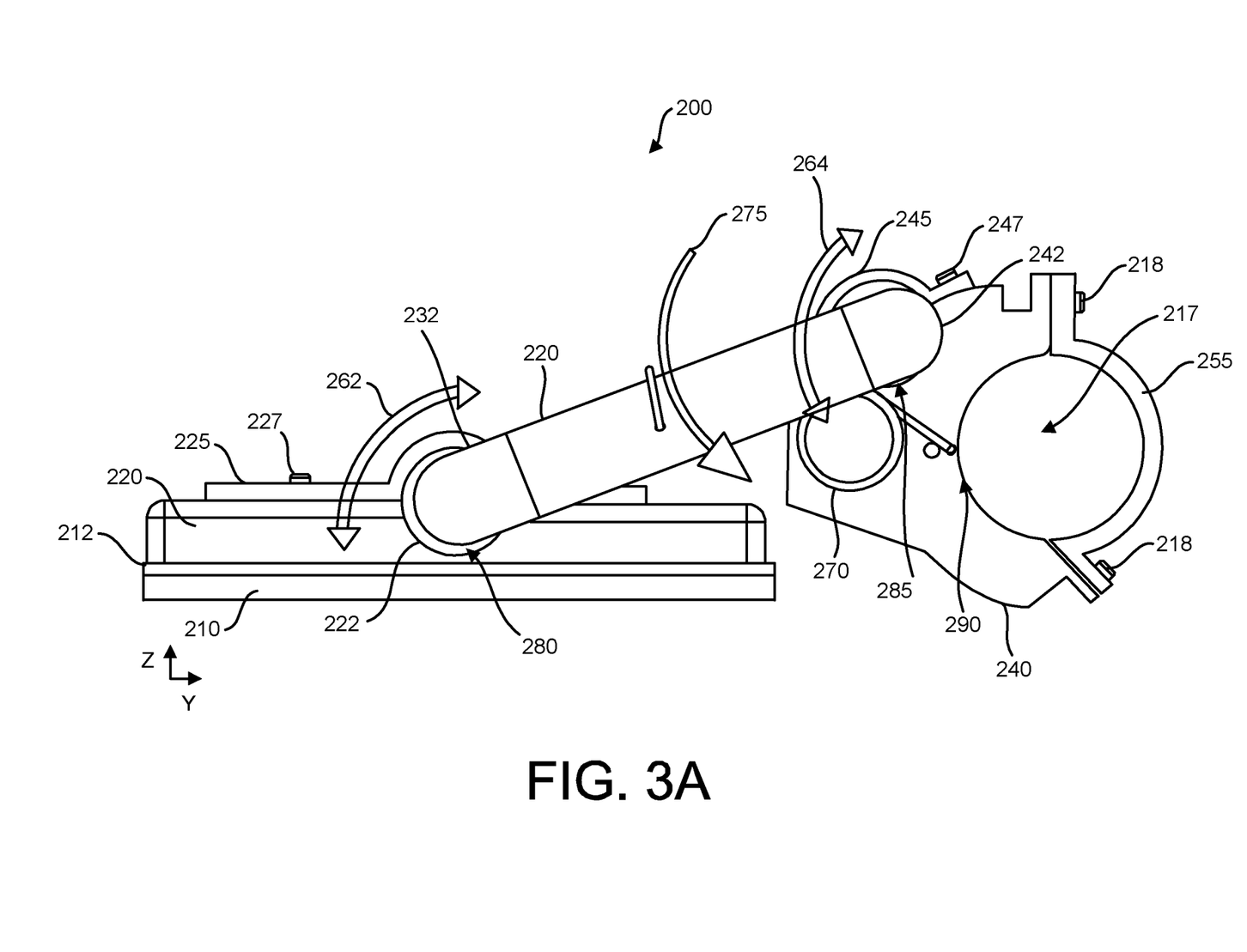
FIG. 3A is a side view of the cooling assembly of FIG. 2.

Referring now to FIG. 3A with continued reference to FIG. 2, the cooling assembly 200 also includes a heat pipe 230. As shown in FIG. 3A, the cold plate 220 defines a first groove 222 for receiving a first end 232 of the heat pipe 230. The first end 232 of the heat pipe 230 is held in place in the first groove 222 in the cold plate 220 by a securing fixture 225, such as a strap.

The cooling assembly 200 also includes a thermally conductive clamp 240. As shown in FIG. 3A, the thermally conductive clamp 240 defines a second groove 242 for receiving a second end 234 of the heat pipe 230. The second end 234 of the heat pipe 230 is held in place in the second groove 242 by a securing fixture 245, such as a strap. The thermally conductive clamp 240 is removably secured to the liquid cooling tube 215 installed on the printed circuit board 205 via a securing fixture 255, such as a bracket.

The cooling assembly 200 further includes a torsion spring 270 that is connectable to the thermally conductive clamp 240 and the heat pipe 230. The torsion spring 270 provides pressure to force the cold plate 220 downward and maintain placement of the heat pipe 230 and the cold plate 220 with respect to the heat sources 210 on the printed circuit board 205. This maintains contact pressure for good thermal conductance.

In operation, the heat pipe 230 transfers heat absorbed by the cold plate 220 to the liquid coolant circulated through the liquid cooling tube 215 via the thermally conductive clamp 240. In particular, the liquid at the first end 232 of the heat pipe 230 vaporizes as the first end 232 of the heat pipe 230 absorbs heat from the surface of the cold plate 220. The vapor then travels within the heat pipe 230 from the first end 232 to the second end 234 and condenses as it comes into contact with the relatively cool second end 234 of the heat pipe 230. The condensation of the vapor releases the heat into the second end 234, and the heat is then transferred from the second end 234 of the heat pipe 230 along a thermal path through the thermally conductive clamp 240 towards the liquid cooling tube 215.

The liquid cooling tube 215 may be pumped with a liquid coolant, such as deionized water at a temperature suitable for cooling electronics devices such as around 45° C., from a cooling liquid supply line (not shown). The cooling liquid supply line may be part of a coolant distribution system, which may include a pump (not shown) to pump the liquid. As the liquid coolant flows past the thermally conductive clamp 240, the liquid coolant in the liquid cooling tube 215 carries heat away from the thermally conductive clamp 240. The flowing liquid coolant exits through a cooling liquid return line (not shown). The heat may then be dissipated by, for example, a radiator (not shown).

The cold plate 220 may be positioned at a variety of positions along the x-axis, the y-axis, and the z-axis with respect to the printed circuit board 205 to accommodate a variety of heat sources on the printed circuit board 205. This provides for a flexible and adjustable cooling system.

To facilitate placement of the cold plate 220 at a desired location along the x-axis with respect to the printed circuit board 205, the thermally conductive clamp 240 is slidable along the surface of the liquid cooling tube 215 as shown by the arrow 250.

To facilitate placement of the cold plate 220 at a desired location along the y-axis with respect to the printed circuit board 205, the length of the heat pipe is adjustable, e.g., by using heat pipes of different lengths.

To facilitate placement of the cold plate 220 at a desired location along the z-axis with respect to the printed circuit board 205, the heat pipe 230 is rotatable at the first end 232 and/or the second end 234, e.g., by pivoting the first end and/or the second end.

It should be appreciated that a heat source need not have a horizontal surface. Having the heat pipe 230 rotatable at the first end 232 allows the cold plate 220 to maintain an inclination that matches a heat source inclination.

Having the heat pipe 230 rotatable at the second end 234 allows the cold plate 220 to accommodate heat sources of different heights in the z-direction. This is advantageous as a single type of cooling assembly 200 can be used to accommodate multiple height differences between heat sources and the liquid cooling tube 215.

Using a single type of cooling assembly to accommodate multiple height differences between heat sources and the liquid cooling tube avoids the need to design a "custom" cold plate for each heat source and/or avoids the need to change the routing of the liquid cooling tubes 215. Avoiding custom cold plates is important because some smaller heat sources may not warrant the cost of having a custom cold plate design. This also enables retro fitting of computing devices including printed circuit boards that were not initially designed to liquid cool certain components without custom cold plate designs or changing liquid cooling tube routing.

According to illustrative examples, the cold plate 220 may be positioned over or near a heat source on the printed circuit board 205 using the heat pipe 230 and the thermally conductive clamp 240 removably secured to the liquid cooling tube 215 without requiring cold plate mounting hardware on the printed circuit board 205 around the heat source to be cooled. This enables the cold plate 220 to be used to cool smaller components on printed circuit boards that are not traditionally liquid cooled such that cold plate mounting hardware is not built into the printed circuit board. This also allows the cold plate 220 to be used to absorb heat from heat sources in locations in which there is no room for mounting hardware on the printed circuit board 205.

Although one cold plate 220, one heat pipe 230, and one thermally conductive clamp 240 are shown for ease of illustration, it should be appreciated that any number of cold plates, heat pipes and thermally conductive clamps may be used to cool any number of heat sources using the existing liquid cooling tubes 215. Further, although the cold plate 220 is described as absorbing heat from one heat source, it should be appreciated that the cold plate 220 may be positioned to absorb heat from multiple heat sources. Additionally, although the heat pipe 230 is depicted in FIG. 2 as having a U-shape, it should be appreciated that the heat pipe 230 may have an L-shape, an S-shape, or any other desired shape such that it is connectable to the cold plate 220 and the thermally conductive clamp 240 and rotatable at the ends the x-axis without hitting components on the printed circuit board 205.

Turning now to FIG. 3A, the cooling assembly 200 may also include a thermal interface material (TIM), such as a gap pad 212. The gap pad 212 may be placed between the heat source(s) 210 emitting heat and the cold plate 230. The gap pad 212 enhances thermal coupling between the heat source(s) 210 and the cold plate 220.

As shown in FIG. 3A, a thermal interface material, such as thermal grease, may be brushed along a surface 280 of the first groove 222 to enhance thermal conductivity between the cold plate 220 and the first end 232 of the heat pipe 230. Similarly, a thermal interface material, such as thermal grease, may be brushed along a surface 285 of the second groove 242 to enhance thermal conductivity between the second end 234 of the heat pipe 230 and the thermally conductive clamp 240.

The thermally conductive clamp 240 is removably secured to the liquid cooling tube (not shown) that fits within a space 217 by a securing fixture 245 using screws 218 and/or other fasteners. A thermal interface material, such as thermal grease, may be brushed along a surface 290 of the thermally conductive clamp 240 that contacts a liquid cooling tube to enhance thermal conductivity.

The first end 232 of the heat pipe 230 is held in place in the first groove 222 in the cold plate 220 by a securing fixture 225 using screws 227 and/or or other fasteners. The second end 234 of the heat pipe 230 is held in place in the second groove 242 by a securing fixture 245 using screws 247 and/or other fasteners.

As further shown in FIG. 3A, the torsion spring 270 that is connectable to the thermally conductive clamp 240 and the heat pipe 230 provides pressure (shown by the arrow 275) to maintain placement of the heat pipe 230 and the cold plate 220 over the heat source(s) 210.

As noted above, the cold plate 220 may be positioned at a variety of positions along the x-axis, the y-axis, and the z-axis to accommodate a variety of heat sources. Rotation of the first end 232 of the heat pipe 230 along the z-axis is represented in FIG. 3A by the arrow 362. Rotation of the second end 234 of the heat pipe 230 along the z-axis is represented in FIG. 3A by the arrow 364.

Figure 3B:
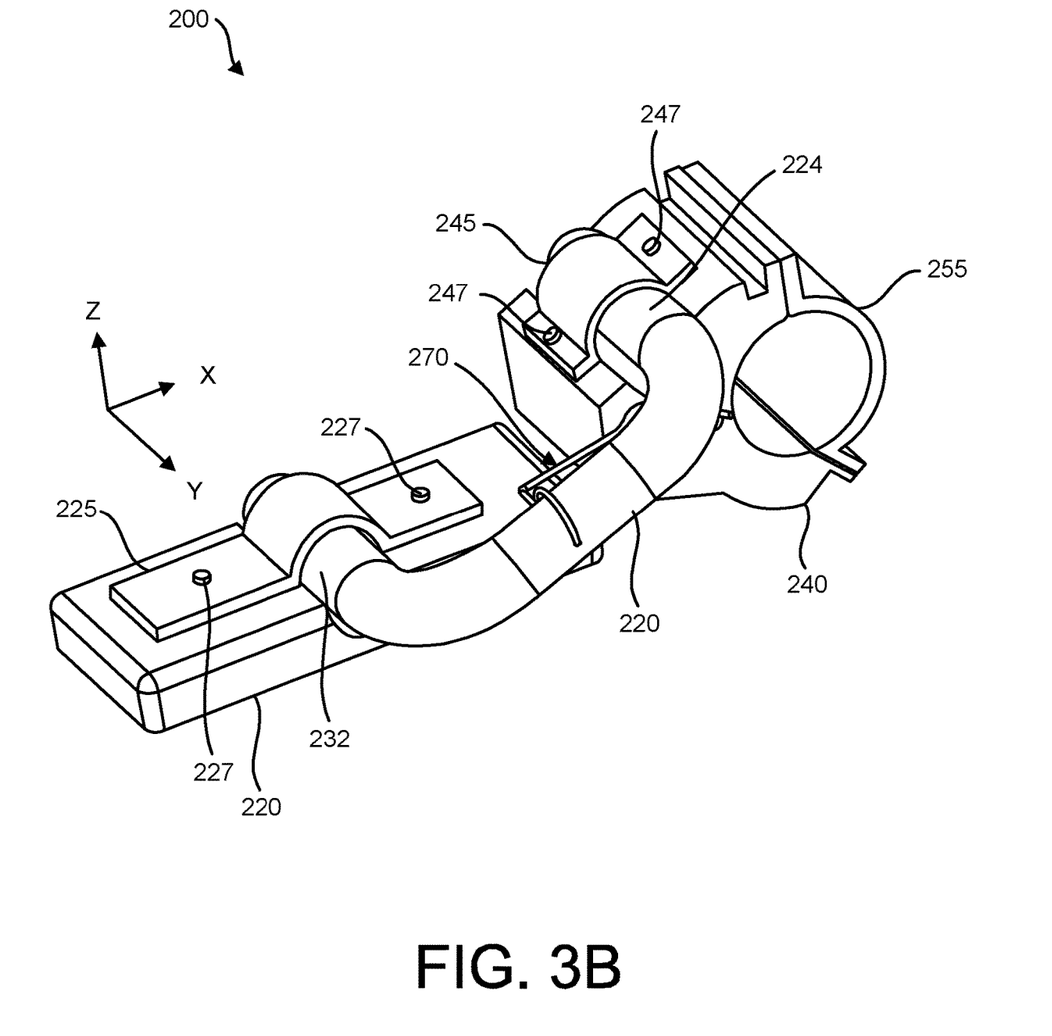
FIG. 3B is an assembled, perspective view of the cooling assembly of FIG. 2 in isolation and from a different perspective than is used in FIG. 2.

Turning now to FIG. 3B, an assembled, perspective view of the cooling assembly 200 of FIG. 2 is shown in isolation and from a different perspective than is used in FIG. 2. From FIG. 3B, it can be seen how the torsion spring 270 fits over the heat pipe 230. As noted above, the torsion spring 270 forces the heat pipe 230 and the cold plate 220 downward to maintain contact pressure for good thermal conductance.

Figure 3C:
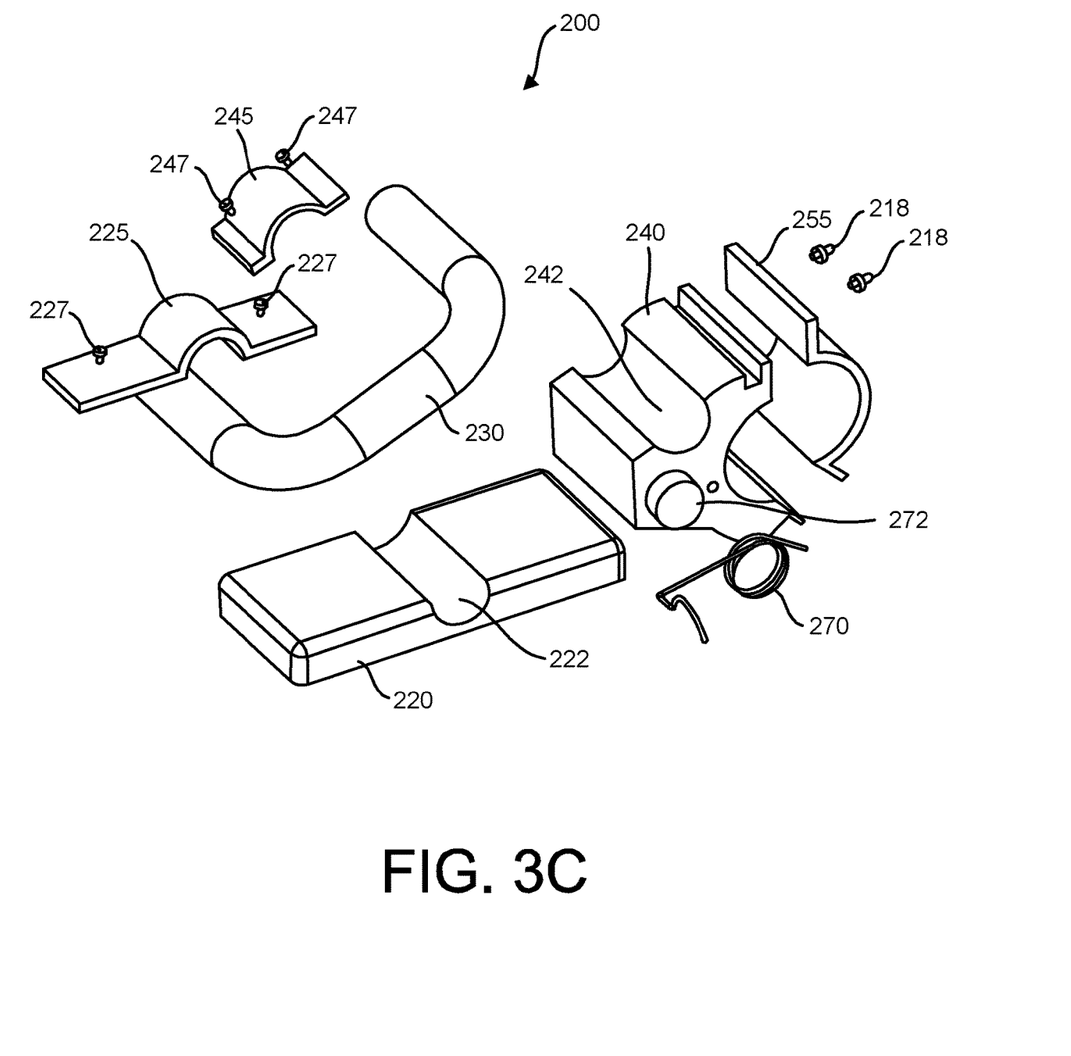
FIG. 3C is an exploded, perspective view of the cooling assembly of FIG. 2 in isolation and from the same perspective as in FIG. 3B.

Turning now to FIG. 3C, an exploded, perspective view of the cooling assembly 200 of FIG. 2 is shown in isolation and from the same perspective as in FIG. 3B. From FIG. 3C, it can be seen how the torsion spring 270 fits over a cylinder 272 on the thermally conductive clamp 240. Also, the first groove 222 defined in the cold plate 220 to receive the first end 232 of the heat pipe 230 is shown in FIG. 3C. Additionally, the second groove 242 defined in the thermally conductive clamp 240 to receive the second end 234 of the heat pipe 230 is shown in FIG. 3C.

Figure 4:
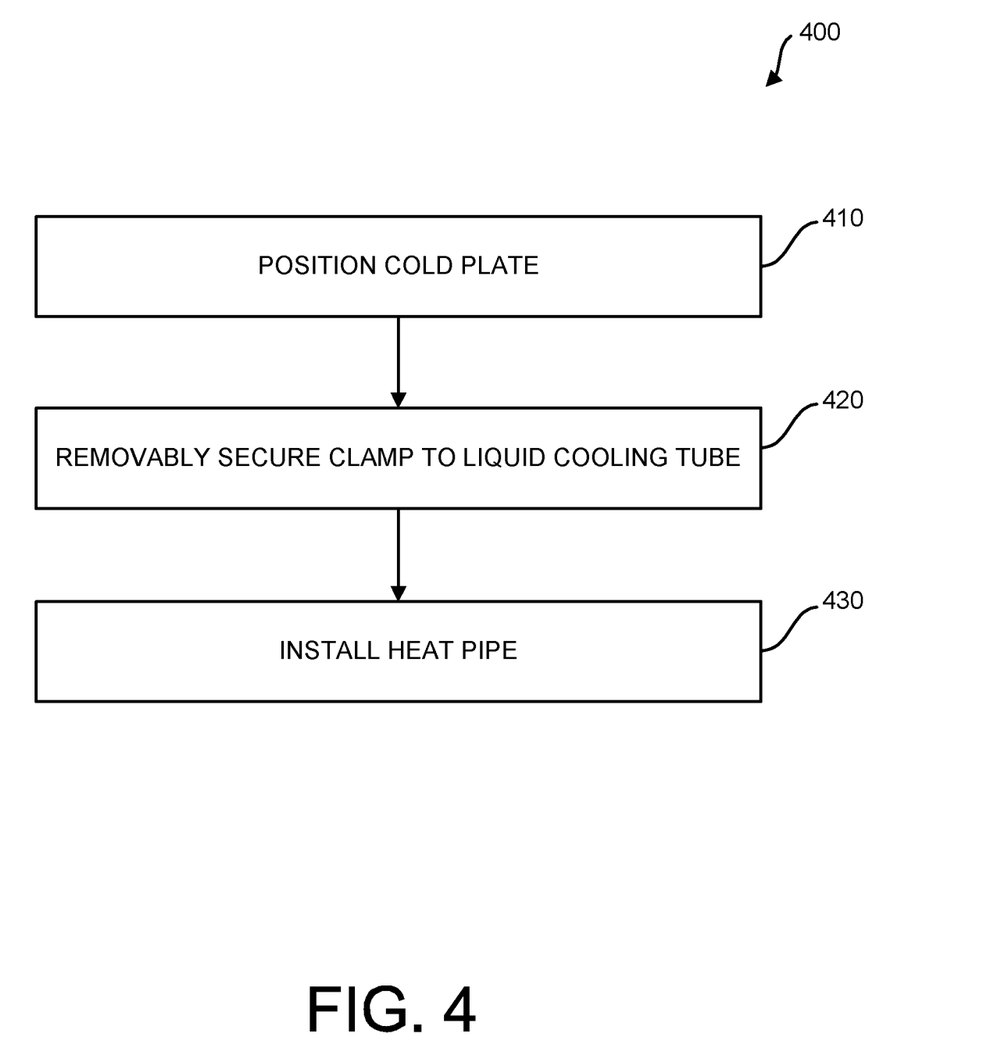
FIG. 4 is a flowchart depicting a method for installing a cooling assembly according to one or more examples of the disclosure.

FIG. 4 is a flowchart depicting a method for installing a cooling assembly according to one or more examples of the disclosure. The process 400 includes positioning a cold plate, such as the cold plate 220 illustrated in FIGS. 2-3C, near or on top of a heat source on a printed circuit board to absorb heat from the heat source (at 410). The cold plate may be positioned over or near an electronic component supported by the printed circuit board or over or near a portion of the printed circuit board that is emitting heat.

A thermally conductive clamp, such as the thermally conductive clamp 240 illustrated in FIGS. 2-3C, is removably secured to a liquid cooling tube installed on the printed circuit board (at 420).

A heat pipe, such as the heat pipe 230 illustrated in FIGS. 2-3C, is installed (at 430) by placing a first end of the heat pipe within a first groove defined in the cold plate and placing a second end of the heat pipe within second groove defined in the thermally conductive clamp. In operation, the heat pipe transfers heat from the cold plate to the liquid cooling tube via the thermally conductive clamp.

It should be appreciated that the method shown in FIG. 4 is by way of example only, and installation of the cooling assembly is not limited to this example. For example, the thermally conductive clamp may be secured to the liquid cooling tube before the cold plate is positioned.

Further, the heat pipe may be attached to the cold plate and the thermally conductive clamp before the thermally conductive clamp is attached to the liquid cooling tube. The heat pipe may then be rotated to position the cold plate over or near a heat source.

In addition, although not shown, the method may including adjusting the position of the cold plate as needed to fit the location, height, and/or inclination of the heat source to be cooled. This may include rotating the heat pipe to adjust the height of the cold plate and/or change the angle of the cold plate relative to the heat source.

Further, although not shown, the method may include brushing thermal grease in the first groove in the cold plate, brushing thermal grease in the second groove in the thermally conductive clamp, brushing thermal grease along a surface of the thermally conductive clamp that contacts a liquid cooling tube, installing a torsion spring, attaching securing fixtures, etc., as described above with respect to FIGS. 2-3C.

In some examples, the method includes providing the printed circuit board that includes the heat source to be cooled prior to performing step 410. "Providing" means obtaining possession or control of the board. The printed circuit board that is provided may be one that has already had the liquid cooling tubes installed therein. In particular, in one example the printed circuit board that is provided is of a previously manufactured computing device, which is to be retrofitted to install one of the example liquid cooling assemblies described herein to cool a heat source that was not liquid cooled in the device as originally manufactured.

As noted above, the system 150 may be a computing device. As used herein, the terminology "computing device" includes any electronic device that includes a processor capable of executing instructions, including, for example, a server, a converged (or hyperconvergred) appliance, a rack-scale system or a node thereof, a high-performance computer system or a node thereof, a storage array, a personal computer, a laptop computer, etc.

Figure 5:
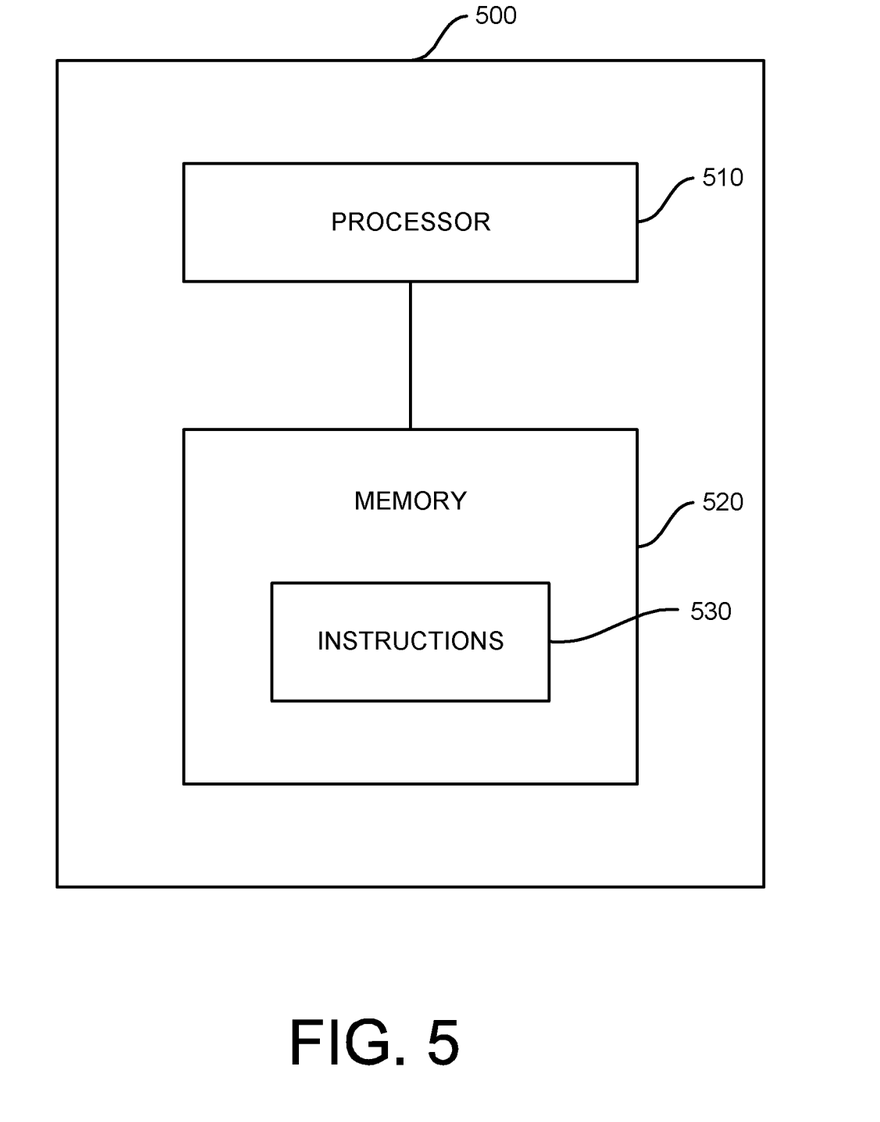
FIG. 5 conceptually illustrates a computing device in which a cooling assembly may be included according to one or more examples of the disclosure.

An example computing device 500 is illustrated in FIG. 5. As shown in FIG. 5, the computing device 500 includes a processor 510 that is communicatively coupled to a memory 520. The processor 510 executes computer-readable instructions 530 stored in the memory 520. Although not shown, the computing device 500 may include additional components, such as input/output (I/O) interfaces, a voltage regulator module (VRM or VRD), a baseboard management controller (BMC), address/data busses, a graphic processing unit (GPU), etc. The components of the computing device 500 may be mounted on a printed circuit board, such as the printed circuit board 205 shown in FIG. 2.

Although a computing device 500 is shown in FIG. 5 as an example of the system 150, the system 150 may be an information-technology device other than a computing device, such as a network switch, a power supply, etc.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A cooling assembly for cooling a heat source in a system, the cooling assembly comprising:
   a cold plate to absorb heat from the heat source, the cold plate defining a first groove;
   a thermally conductive clamp removably secured to a liquid cooling tube installed in the system, the thermally conductive clamp defining a second groove;
   a heat pipe including a first end to fit within the first groove in the cold plate and a second end to fit within the second groove in the thermally conductive clamp to, in operation, transfer heat absorbed by the cold plate to the liquid cooling tube via the thermally conductive clamp; and
   a torsion spring connectable to the heat pipe and the thermally conductive clamp to provide pressure to maintain placement of the heat pipe and the cold plate with respect to the heat source.

2. The cooling assembly of claim 1, wherein at least one of the first end and the second end of the heat pipe are rotatable to facilitate placement of the cold plate at a desired location along a z-axis.

3. The cooling assembly of claim 1, wherein the thermally conductive clamp is slidable along the liquid cooling tube to facilitate placement of the cold plate at a desired location along an x-axis.

4. The cooling assembly of claim 1, wherein a length of the heat pipe is adjustable to facilitate placement of the cold plate at a desired location along a y-axis.

5. A method, comprising:
   positioning a cold plate to absorb heat from a heat source on a printed circuit board, the cold plate defining a first groove;
   removably securing a thermally conductive clamp to a liquid cooling tube installed on the printed circuit board, the thermally conductive clamp defining a second groove;
   install a heat pipe by:
      placing a first end of the heat pipe within the first groove in the cold plate; and
      placing a second end of the heat pipe within the second groove in the thermally conductive clamp, the heat pipe, in operation, transferring heat from the cold plate to the liquid cooling tube via the thermally conductive clamp; and
   attaching a torsion spring to the thermally conductive clamp and the heat pipe to provide pressure to maintain placement of the heat pipe and the cold plate with respect to the heat source on the printed circuit board.

6. The method of claim 5, wherein the heat source is an electronic component supported by the printed circuit board.

7. The method of claim 5, wherein the heat source is a portion of the printed circuit board that emits heat.

8. The method of claim 5, further comprising rotating at least one of the first end and the second end of the heat pipe to facilitate placement of the cold plate at a desired location along a z-axis with respect to the printed circuit board.

9. The method of claim 5, further comprising sliding the thermally conductive clamp along the liquid cooling tube to facilitate placement of the heat pipe at a desired location along an x-axis with respect to the printed circuit board.

10. The method of claim 5, further comprising adjusting a length of the heat pipe to facilitate placement of the cold plate at a desired location along a y-axis with respect to the printed circuit board.

11. A system, comprising:
   a printed circuit board;
   a heat source on the printed circuit board;
   a liquid cooling tube installed on the printed circuit board; and
   a cooling assembly including:
      a cold plate positioned to absorb heat from the heat source, the cold plate defining a first groove;
      a thermally conductive clamp removably secured to the liquid cooling tube, the thermally conductive clamp defining a second groove;
      a heat pipe including a first end to fit within the first groove in the cold plate and a second end to fit within the second groove in the thermally conductive clamp to, in operation, transfer heat absorbed by the cold plate to the liquid cooling tube via the thermally conductive clamp; and
      a torsion spring secured to the thermally conductive clamp and connectable to the heat pipe to provide pressure to maintain placement of the heat pipe and the cold plate with respect to the heat source on the printed circuit board.

12. The system of claim 11, wherein the heat source is an electronic component supported by the printed circuit board.

13. The system of claim 11, wherein the heat source is a portion of the printed circuit board that emits heat.

14. The system of claim 11, further comprising a gap pad between the heat source and the cold plate to enhance thermal conductivity.

15. The system of claim 11, wherein at least one of the first end and the second end of the heat pipe is rotatable to facilitate placement of the cold plate at a desired location along a z-axis with respect to the printed circuit board.

16. The cooling system of claim 13, wherein the thermally conductive clamp is slidable along the liquid cooling tube to facilitate placement of the cold plate at a desired location along an x-axis with respect to the printed circuit board.

17. The cooling system of claim 13, wherein a length of the heat pipe is adjustable to facilitate placement of the cold plate at a desired location along a y-axis with respect to the printed circuit board.

* * * * *